Figure 1:
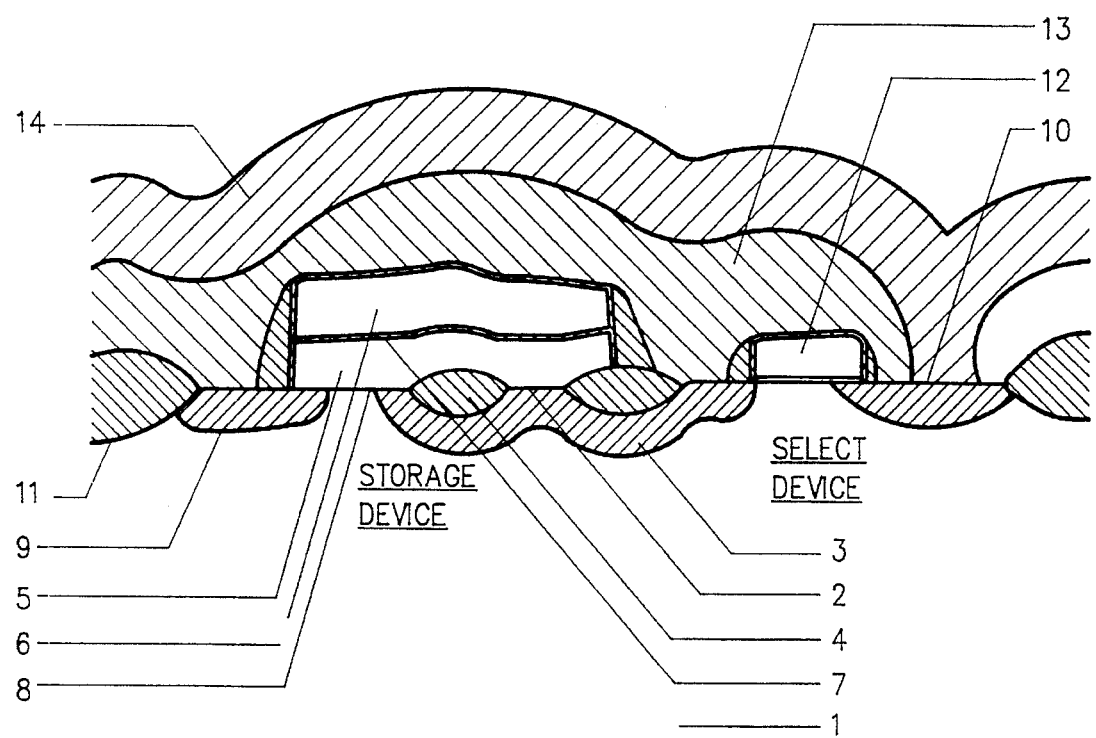

United States Patent [19]

Thomas

[11] Patent Number: 5,519,653
[45] Date of Patent: May 21, 1996

[54] CHANNEL ACCELERATED CARRIER TUNNELING-(CACT) METHOD FOR PROGRAMMING MEMORIES

[76] Inventor: Mammen Thomas, 1081 Corvette Dr., San Jose, Calif. 95129-2906

[21] Appl. No.: 209,787

[22] Filed: Mar. 11, 1994

[51] Int. Cl.$^6$ ..................................... G11C 11/34
[52] U.S. Cl. ..................... 365/185.01; 257/317
[58] Field of Search .................. 365/185, 900; 257/317, 322

[56] References Cited

U.S. PATENT DOCUMENTS

| | | | |
|---|---|---|---|
| 4,816,883 | 3/1989 | Baldi | 365/185 X |
| 4,888,734 | 12/1989 | Lee et al. | 365/185 |

*Primary Examiner*—Do Hyun Yoo

[57] ABSTRACT

A Channel Accelerated Carrier Tunneling method of programming high speed, low voltage, memory cells, typically non-volatile memory cells, using the majority carriers available in an MOS channel is disclosed. The method uses the velocity of the majority carriers in the channel, the kinetic energy available, to enhance the accelerating voltage applied towards a storage electrode to enhance the collection and storage of the carriers by the storage electrode, typically a floating gate in a non-volatile memory. The method envisages a discontinuity in the channel which allows the carriers to be accelerated towards it. By having a storage electrode with voltage gradient, over lying the discontinuity, in the direction of acceleration of the carriers, these carriers can be made to pass through the oxide barrier of the gate and accumulate on the storage node. The use of the acceleration of the carriers allow the additional applied field requirement, to cause tunneling, to be lower and hence the voltages applied to the control gate can be lower in value. In addition the availability of the large population of majority carriers in the channel under operating conditions of voltage and current, having the correct directional velocity component, allows the memory to be written at high speeds. The large number of channel majority carriers also allow the use of lower junction voltages in the device, as no additional carrier generation by alternate methods, like impact ionization, is needed. This in effect allows the manufacture of high speed, low voltage memory cells for applications in high density memories. The use of low fields and low voltages also tend to enhance the reliability of the cells by reducing the stresses on the device elements.

2 Claims, 6 Drawing Sheets

CHANNEL ACCELERATED TUNNELING ELECTRON (CATE- 1) CELL (CROSS SECTION)

EEPROM CELL (CROSS SECTION)
PRIOR ART

EEPROM WRITE
PRIOR ART

DIRECTION OF FORCE
ON CARRIER

EPROM CELL (CROSS SECTION)
PRIOR ART

EPROM WRITE / PROGRAM

DIRECTION OF FORCE ON CARRIER

CHANNEL ACCELERATED TUNNELING ELECTRON (CATE- 1) CELL (CROSS SECTION)

CACT - PROGRAM

DIRECTION OF FORCE ON CARRIER 5,519,653

CHANNEL ACCELERATED CARRIER TUNNELING-(CACT) METHOD FOR PROGRAMMING MEMORIES

FIELD OF INVENTION

This invention relates to a method of programming memory cells, typically non-volatile memory cells, using majority carriers.

BACKGROUND—DESCRIPTION OF PRIOR ART

Currently methods for programming or writing of non-volatile memory cells fall into two categories. They are a) The EEPROM write.
b) The EPROM write.

a) The EEPROM write

This method of writing or programming a non volatile memory involves application of a high potential gradient across a thin oxide designated tunnel oxide which has a thickness of the order of 50 to 150 Angstroms. The potential gradient is applied by directing a high voltage to the nodes on either side of the oxide barrier. If a sufficiently high potential gradient can be established, typically of the order of 1 MV/cm of oxide thickness, then electrons in the silicon can be provided enough energy to overcome the potential barrier of the oxide and reach the positive floating or storage node by tunneling. These electrons charge the electrode to a negative potential and allow modification of the threshold of a device, allowing the possibility of data storage.

FIG. 1 shows the typical EEPROM cross section. A diffused region (3) with n-diffusion is disposed trader a thin tunnel oxide region (2) typically having a thickness of 50 to 150 A. A first floating gate conductive material (5), typically doped poly silicon is disposed over the tunnel oxide and also extends over a gate oxide (8) disposed over a channel region of an MOS device. A second conductive layer (6), typically a doped polysilicon, over lays the floating gate and is separated from the floating gate by an insulating layer (7), typically oxide or ONO. The second conductive layer acts as the control gate. During write the diffused region (3) is held at ground voltage while a high voltage, typically ranging from 12 to 22 V, is applied to the control gate. This high voltage gets capacitively coupled down to the floating gate. The voltage to which the floating gate is raised depends on the coupling ratio $Cx=Cpp/Ctot$, where $Cpp$ is the poly to poly capacitance and $Ctot$ is the total capacitance on the floating gate. This floating gate voltage appears across the tunnel oxide. By applying a sufficiently high voltage on the control gate, to provide a high field across the tunnel, carriers can be made to tunnel across from the diffused region to the floating gate. The applied high voltage is limited by the break down voltage of the tunnel and inter poly insulator. In most EEPROM a select device (12) in series with the storage device is used to isolate the storage device during write.

Figure 2:
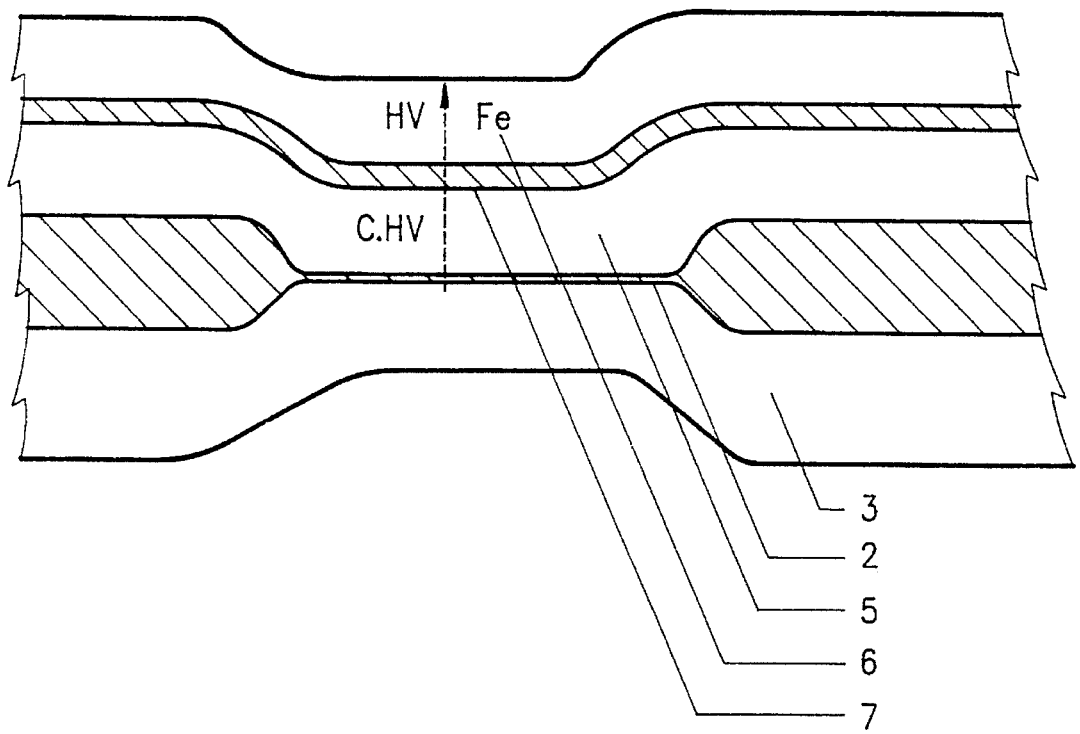
Figure 2:
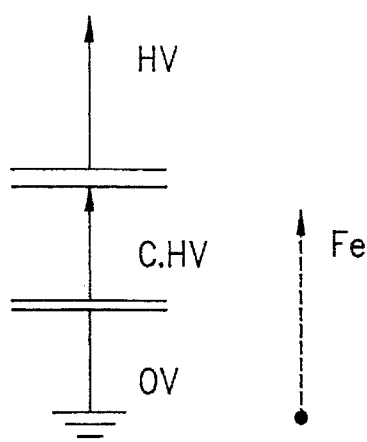

The typical resultant field directions in an EEPROM during write are shown in FIG. 2. As can be seen the field "Fe" due to the applied high voltage HV which influence the tunneling process in an EEPROM is in a direction perpendicular to the tunnel oxide and into the floating gate.

Main disadvantages of EEPROM write method are:

1. Need for generating a high field across the tunnel oxide by applied voltage alone makes application of high voltages necessary.
2. The tunneling is a process which is proportional to the applied field and slows down as the floating gate gets charged.
3. The slow charging of the floating gate with the changing field across the tunnel oxide also makes it necessary to have a high enough voltage on the floating gate initially to achieve sufficient voltage differential at the end of programming between the two sense levels during read.
4. Tunneling process is slow, as carriers have to be generated by breaking silicon bonds and providing sufficient energy to tunnel, and typically take anywhere from 1 to 10 mil seconds to reach completion.

b) The EPROM write:

EPROM write is a method of writing the non volatile memory in which the high saturated velocity of the electrons in the high field depletion area, produced by application of a high drain voltage, typically from 5.5 to 9 V, of an MOS device in saturation is used to generate a large volume of high energy carriers or hot electrons by impact ionization, of which a proportion having the correct energy levels is provided enough additional acceleration by a high voltage, typically of the order of 5.5 to 10 V applied to a floating electrode to overcome the barrier and get collected by it. The fields at the drain depletion which support the carrier generation is improved by higher drain voltages and higher gate oxide thicknesses, since the devices have to be in saturation. A higher drain voltage and gate voltage is also necessary to provide sufficient number of electrons in the channel to generate the volume of impact ionized carriers necessary for complete write. The high volume of the carriers generated ensures that even the small percentage collected by the floating gate is sufficient to provide a reasonably large swing in threshold of the MOS device.

Figure 3:
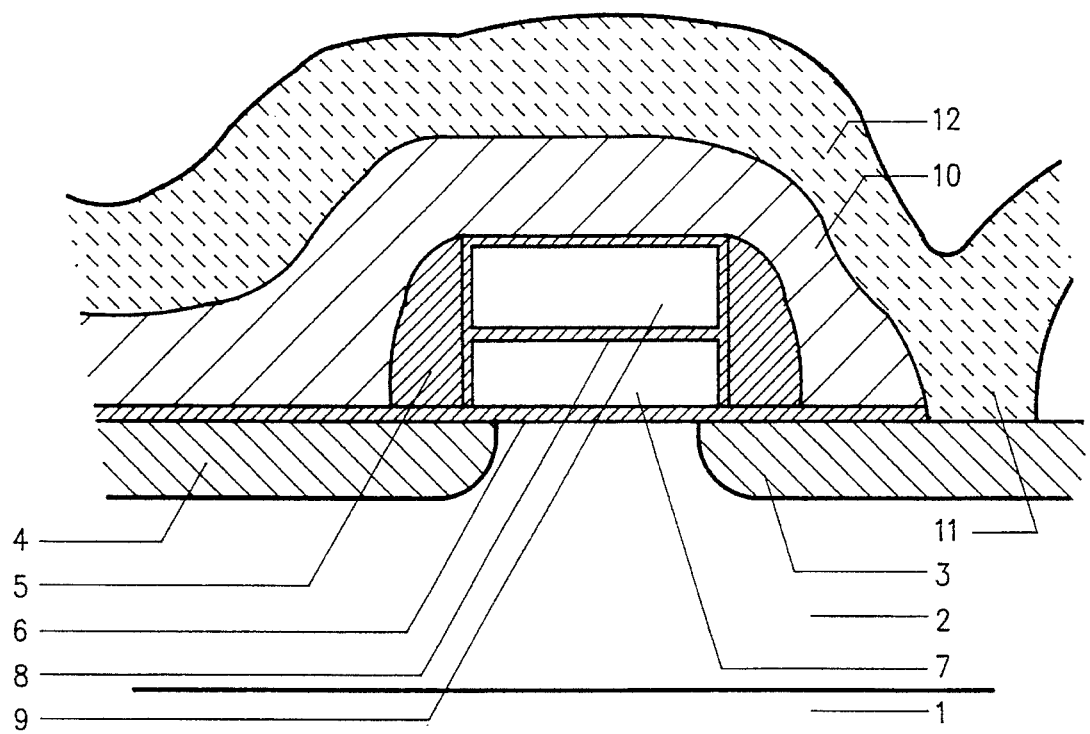

FIG. 3 is the cross sections of a typical EPROM. AMOS channel is formed under a gate oxide (6) on a doped substrate (1) between a source region (4), doped with an impurity of the opposite type to the substrate, and a doped drain region (3), doped similar to the source. Overlying the gate oxide is a conductive floating gate electrode (7), typically formed by a doped polysilicon layer. A second conductive layer(9), typically a doped polysilicon layer, overlying the floating gate layer and separated from it by an insulating layer (8), typically oxide or ONO, forms a control gate. During write a high voltage, typically in the range of 10 to 15 V is applied, to the control gate which gets capacitively coupled down to the floating gate raising the floating gate voltage. A high drain voltage is applied to conduct a high current and also take the device into saturation. This forms a high field in the drain depletion region where impact ionization generates a large carrier concentration having high energies. The voltage on the floating gate, from the coupled down high voltage on the control gate, provides the additional energy to allow acceleration and collection of a small percentage of the generated hot electrons by the floating gate. The write process is faster than the tunneling process, typically taking 10 to 100 micro seconds only.

Figure 4:
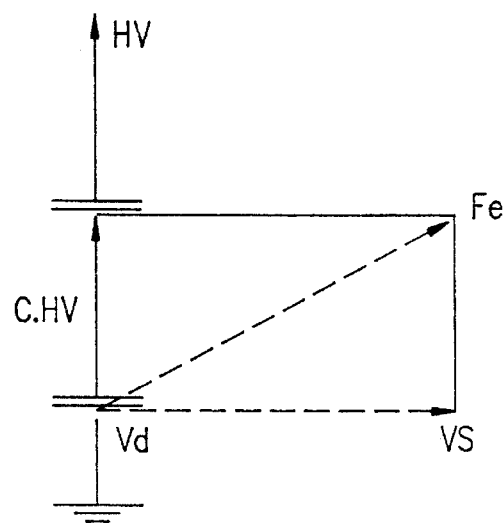
Figure 4:
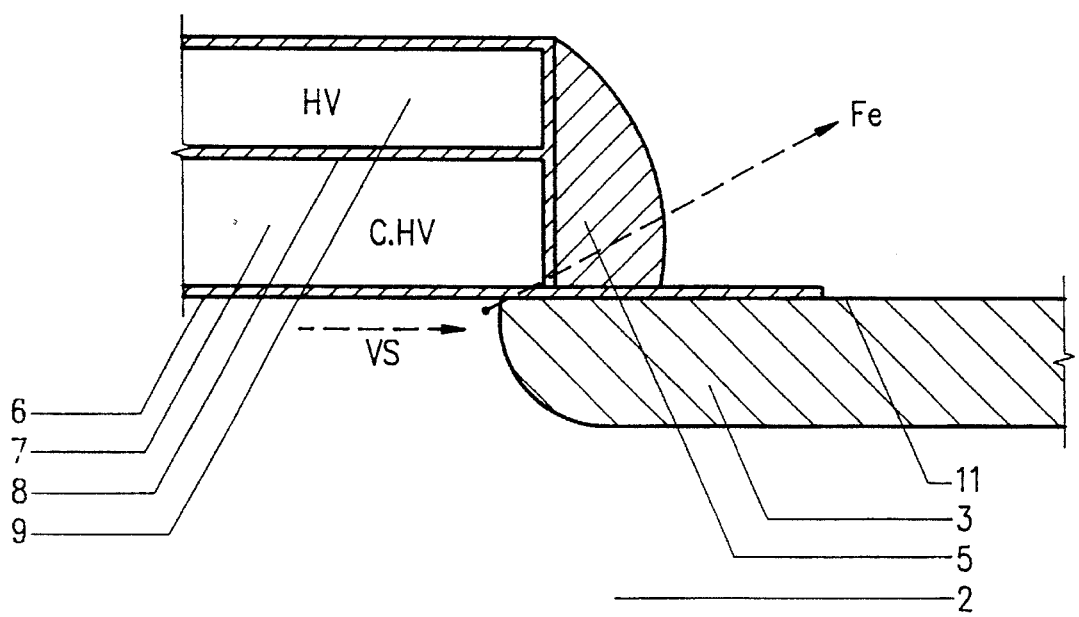

The fields applied and the resultant field in an EPROM write is shown in FIG. 4. The force on a carrier in an EPROM during programming, due to the carrier velocity and the voltage(Vd) applied to the drain (3), tend to oppose that due to the voltage (C.HV) on the storage electrode(7) coupled down from the control electrode (9).

Major disadvantages of EPROM write method with hot electrons:

1. EPROM write uses high voltage and high current to produce the hot electrons at the drain depletion hence needs high voltage, high current supplies.

2. High gate voltages are used on the gate to collect the carriers.

3. The hot electron write process is much faster than tunneling but is still slow compared to other types of memories, typically needing over 10 micro-seconds.

4. The high fields used reduce the device reliability.

5. During the hot electron generation by impact ionization, a large volume of positively charged carriers is also generated which needs to be removed through the substrate to prevent reliability problems with the circuit.

OBJECTS AND ADVANTAGES OF DISCLOSED METHOD

The Channel Accelerated Carrier Tunneling (CACT) method of writing a memory cell, typically a non volatile memory cell, achieves the following objectives and has the following advantages over the prior art methods:

1. The method by virtue of using the energy available in the velocity of the carriers in the channel, in the form of kinetic energy, is able to effectively reduce the barrier height of the oxide separating the channel from the floating gate, allow lower voltage to be used on the floating gate during write. This allows for reduction in control gate voltage from those used in prior art cells.

2. The use of the majority carriers in the channel for carrying charge into the floating gate allows for the elimination of the need to generate large volumes of additional carriers by impact ionization in the drain depletion region, needed in EPROM write. This in turn reduces the need to have high power supply, with high current and high voltage, for the drain.

3. The reduction of need for high voltage and high power supplies allow for easier use of the cells in high volume applications with a single low voltage supply.

4. The use of the large volume of carriers in the channel most having energies correctly oriented for collection allow for very fast write process, unlike the prior art cells where only a fraction of the carriers get collected by the floating gate electrode.

5. The elimination of the need to have high drain fields, dining write process, reduce the stress the cell gate oxide is subjected to, and the hot electron degradation associated with it, improving the cell reliability.

6. The elimination impact ionization for generation of carriers, during write process, reduce the substrate current, due to carriers of the opposite type, improving cell and circuit reliability.

7. The reduction in high voltage needs allow for closer packing density due to reduction in isolation requirements.

8. The reduction of high voltage allows easier scaling of cells as technology scales enabling higher speeds to be achieved.

DRAWING FIGURES

FIG. 1—is the cross section of a typical prior art EEPROM cell.

FIG. 2—is the vector representation of the direction of forces on a carrier in the tunnel diffusion during the tunnel write process.

FIG. 3—is the cross section of a typical prior art EPROM cell.

FIG. 4—is the vector representation of the direction of the forces acting on a carrier in the drain depletion region during the hot electron write process.

Figure 5:
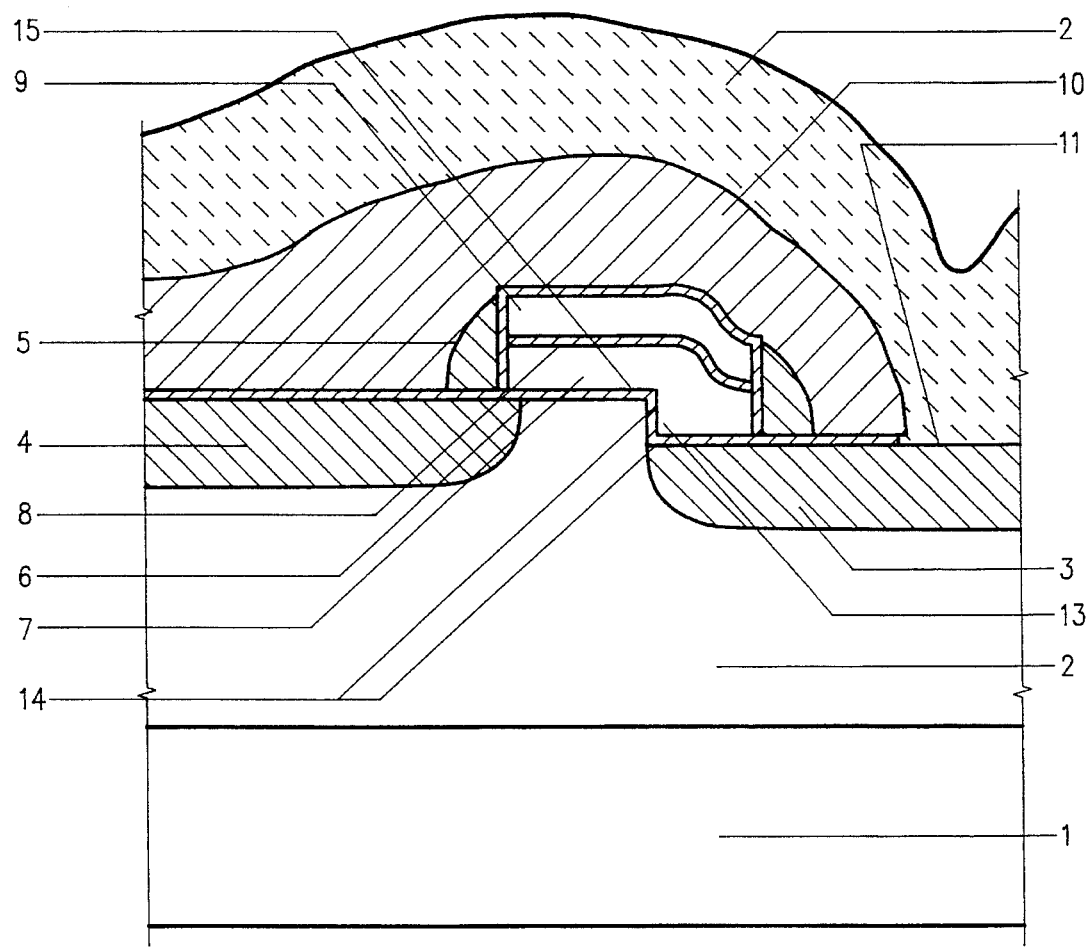

FIG. 5—is a cross section of a cell with Channel Accelerated Tunneling Electrons (CATE-1 cell) for the write (CACT method of write), one typical implementation.

Figure 6:
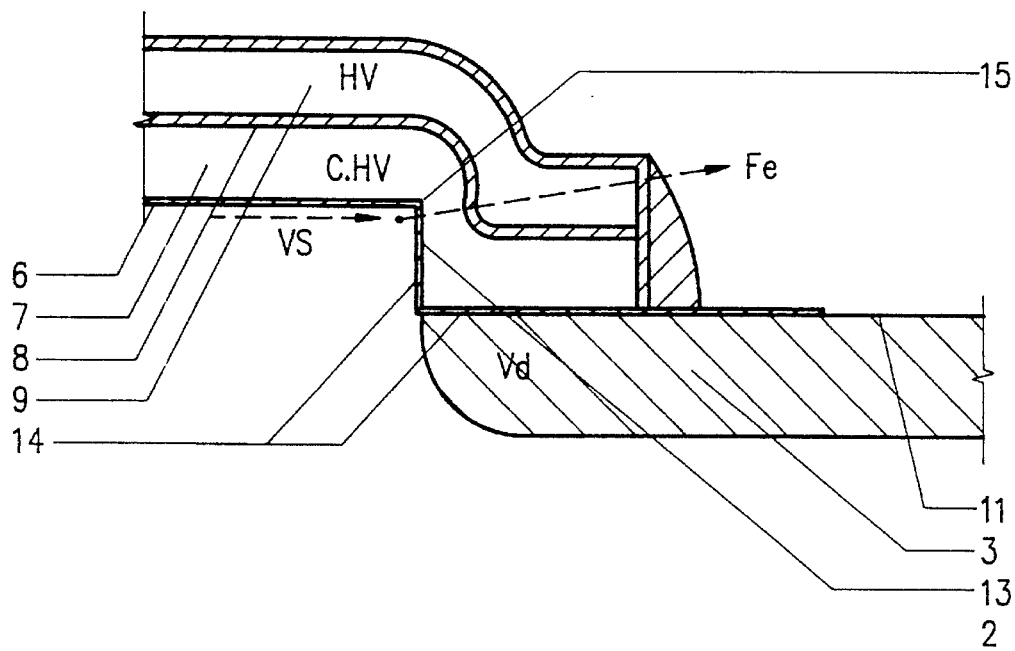
Figure 6:
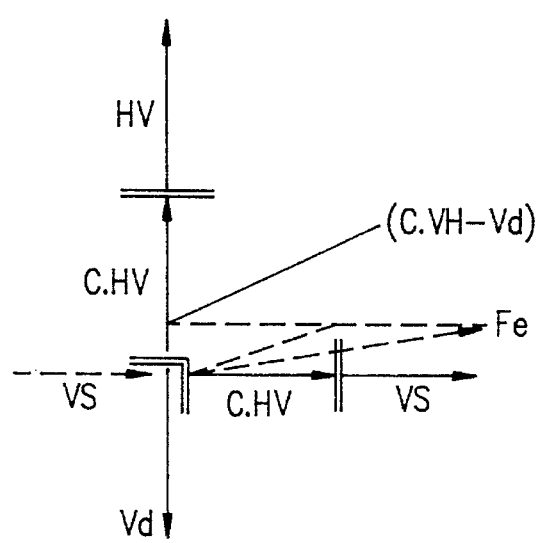

FIG. 6—is the vector representation of the forces on a carrier during CACT write.

REFERENCE NUMERALS

Reference numerals in drawing

FIG. 1 (EEPROM cross-section) & FIG. 2 (EEPROM Write, Direction—Force on carrier)

1. Semiconductor substrate.
2. Tunnel oxide.
3. Tunnel diffusion.
4. Buried oxide.
5. Floating gate electrode storage node—doped polysilicon layer 1.
6. Control gate electrode—doped polysilicon layer 2.
7. Oxide or ONO dielectric separating the floating gate and control gate electrodes.
8. Gate oxide over the read channel.
9. Source diffusion
10. Drain diffusion contact of select device.
11. Field oxide.
12. Select transistor, word line select.
13. Inter layer protection oxide.
14. Metal bit line.

Reference numerals in drawing

FIG. 3. (EPROM cross-section) & FIG. 4 ( EPROM Write, Direction—Forces on Carrier)

1. Silicon substrate.
2. Epitaxial layer.
3. Drain diffusion.
4. Source diffusion.
5. Oxide spacer.
6. Gate oxide over lying the channel.
7. Floating gate electrode storage node—doped polysilicon layer 1.
8. Insulating oxide or ONO layer separating the floating gate and the control gate electrodes.
9. Control gate electrode—doped polysilicon layer 2, also forms the word line.
10. Inter layer protection oxide.
11. Bit line contact
12. Metal bit line.

Reference numerals in drawing

FIG. 5 (CATE-1 cell) & FIG. 6 (CACT Write, Direction—Forces on Carrier)

1. Silicon substrate.
2. Epitaxial layer.
3. Drain diffusion.
4. Source diffusion.
5. Oxide spacer.
6. Gate oxide over lying the channel.
7. Floating gate electrode storage node—doped polysilicon layer 1.

8. Insulating layer separating the floating and the control gate electrodes.

9. Control gate electrode—doped polysilicon layer 2, also forms the word line.

10. Inter layer protection oxide.

11. Bit line contact

12. Metal bit line.

13. Step etched into silicon to create the gate discontinuity.

14. Oxide grown on the side wall and bottom of step in silicon.

15. Point of gate discontinuity.

Reference Letters in FIG. 2, FIG. 3 & FIG. 4

(the forces are proportional to applicable Voltages and the carrier velocity)

HV Voltage applied to Control gate electrode.

C Capacitive coupling coefficient between the electrode (6) and the storage electrode(5), across the dielectric (7) vs Carrier velocity in channel.

Vd Drain Voltage.

Fe Resultant force on carrier during programming

DESCRIPTION OF INVENTION

The present invention relates to a method of improving the write characteristics of a non-volatile memory cell using Channel Accelerated Carrier Tunneling. A cell using this method of write can be made to operate at lower voltages than the present day EPROM base or EEPROM based non volatile memories, have higher speed during write and provide improved reliability of operation.

The present day memory cells used in non volatile applications use either impact ionization as in the case of EPROM or application of a very high voltage to a doped region as in the case of EEPROM to generate the carriers, typically electrons to write into the cell. In the case of EPROM write only a small percentage of the electrons generated, by impact ionization at the drain junction, have sufficient energy in the direction of the floating gate electrode, that will allow collection by the floating gate even after a high accelerating voltage is impressed on that gate through coupling from the control gate electrode. The resultant forces acting on the electron and the direction of the force are shown in FIG. 4. During impact ionization, electrons are produced with velocities in all directions at the point of impact. Only those electrons which have the correct velocity component, (a very small percentage of total generated carriers), to assist in the movement into the floating gate are collected by the floating gate and used to charge the node during write process. The low yield of charging carriers make it essential to generate as large a number as possible for improved write speeds. This makes it necessary to use high voltage, high current power supply on the drain node, for generation of high fields, and high voltage on the control gate, for enabling collection, during write. The EPROM write process during impact ionization generates carrier pairs namely both polarities of carriers are generated. The carrier, typically holes or the positively charged carriers, have to be collected and removed by the substrate. This large volume of unused carriers being pumped into the substrate during the write process can create problems of latch up in the circuit reducing the reliability of the memory. This component of power drained from the supply for generation of unusable carriers is complete waste but need to be supplied.

In the case of the EEPROM the applied voltage across a thin tunnel oxide is used to pull electrons free from a doped region under the tunnel oxide and provide these electrons enough energy to tunnel through the thin oxide. The resultant forces on an electron are shown in FIG. 2. This process uses high fields generated by application of high voltages across a thin oxide barrier one side of which is the floating gate electrode and the other side the doped substrate region. The application of high fields produces high stresses in the oxide with resultant reliability problems as is well known to practitioners of the art.

As can be understood, both these methods are slow during write as the available population of usable electrons during the write process is limited and cannot be increased without adverse effects in the circuit functionality and cell reliability. Hence the EPROM and EEPROM memories are slow write memories, The EEPROM being typically an order of magnitude slower than the EPROM.

CHANNEL ACCELERATED CARRIER TUNNELING WRITE

The new write method using Channel Accelerated Carrier Tunneling (CACT), proposed for the non volatile memory overcomes the problem of availability of usable carriers with the correct directional velocity during write process and hence tend to speed up the write process. It also has the advantage of using lower power, both voltages and currents during the write process, as this disclosed method uses majority carriers in the channel, and secondary carrier generation with the accompanying generation of carrier of the opposing polarity type is eliminated. The velocity of the carriers in the channel is used to enhance the force due to the voltage applied on the control gate electrode and coupled down to the floating gate electrode to enable the collection of carriers by the floating electrode. This will reduce the control gate voltage that need to be applied during write.

TYPICAL CELL

A number of different structures for implementing the Channel Accelerated Carrier Tunneling write method are possible. A typical cell structure FIG. 5 (CATE1 cell) is used to explain the method used.

FIG. 5 is the cross-section of a typical implementation of Channel Accelerated Tunneling Electron (CATE1) Memory cell which uses CACT method of writing into the memory. In the disclosed embodiment a P-type Epitaxial layer (2) is disposed over a P-type substrate silicon (1). A first gate oxide (6)is disposed on the surface of the silicon. A step(13) is etched into the Epitaxial layer and a second thinner gate oxide (14) is disposed over the vertical step and the horizontal etched surface. An impurity diffusion of opposite type to the Epitaxial doping, N-type in this embodiment is introduced into the silicon to form the drain (3) and the source (4) of the device. A conductive layer(7), typically doped polysilicon overlying the gate oxide between the source and drain regions including the oxide along the side wall form the floating gate. A second conductive layer(9), typically doped poly-silicon overlying the floating gate but isolated from it by an insulating layer, typically ONO(8), forms the control gate of the device and the select word line for the array. An MOS device having a channel under the gate oxides extending from the source(4) to the drain (3) is hence formed. The step etched in the silicon (13) and the gate oxide thereon(14) provide the discontinuity in the channel at the corner (15). The use of the thinner oxide (14)

allows the carriers in the channel to reach velocity saturation close to the discontinuity by keeping the threshold of the gate under the thin oxide lower. This optimizes the carrier velocity for collection. The Gate side walls are protected and isolated by oxide grown on polysilicon and deposited oxide forming an oxide spacer (5). A thick deposited insulator, inter layer dielectric layer(10), isolates the device from the metal bit line(12) making contact (11)to the drain diffusion of the device in the current embodiment. Other process and structural details common to semiconductor processing well known to the practitioners of the art are not detailed.

During write operation an accelerating voltage is applied to the drain (3)of the memory cell and a gate voltage, higher than that needed to mm the channel on, is applied to the control gate(9). This control gate voltage is coupled down to the floating gate(7) by capacitive coupling between the gates across the insulator(8) separating them. This turns the device on and allows flow of electrons in the channel. These charge carriers are accelerated by the drain voltage and the resultant voltage on the floating gate. The use of a discontinuity (15) in a direction perpendicular to the direction of velocity of carriers in the channel allow the kinetic energy of the carriers to be used to effectively reduce the barrier height of the oxide(14) at the discontinuity and enhance the efficiency of collection of the channel carriers by the floating gate.

The applied and the resultant forces on the carriers at the point of discontinuity during programming is shown in FIG. 6. The use of the kinetic energy to enhance the force applied to the carriers by the voltage (C.HV) on the floating gate(7) due to the applied voltage (HV) on the control gate, allow use of lower voltages on the floating gate and hence on the control gate. It can be seen from the FIG. 6 that the force(Fe) on the carrier in CACT programming is directed essentially towards the storage node enhancing the write process. The use of the large carrier concentration in the channel during write, with velocity component(vs) in the direction perpendicular to the oxide interface at the point of discontinuity, eliminate the need to generate additional carriers by impact ionization or application of high fields, and reduce the need for high voltages on the drain. This in turn reduces the stress on the oxide and hence improve the reliability of the cell. The large carrier concentrations also reduce the write times required by the cell.

ADVANTAGES OF THE METHOD DISCLOSED

1. The method by using the energy available in the velocity of the carriers in the channel, as kinetic energy, is able to reduce the additional force required for collection of carriers by the storage node. This allows for lower voltage on the floating gate and hence reduction in control gate voltage unlike the prior art cells.
2. The use of the majority carriers available in the channel as charge carriers to move into the floating gate allows for the elimination of the need to generate large volumes of carriers by impact ionization in the drain depletion region, needed in EPROM write. This reduces the need to have high power, high current and high voltage supply at the drain of the memory cell
3. The reduction of need for high voltage and high power supplies allow for easier use of the cells in high volume applications with a single low voltage supply.
4. The use of the large volume of carriers in the channel, most having energies correctly oriented for collection, allow for very fast write process, unlike the prior art cells.
5. The elimination of high drain and gate fields reduce the stress that the cell gate oxide is subjected to and the hot electron degradation, allowing high reliability to be achieved.
6. The elimination of impact ionization for generation of carriers reduce the substrate current in the cell improving cell and circuit reliability.
7. The reduction in high voltage allow for closer packing density due to reduction in isolation requirements.
8. The elimination of high voltage also allows easier scaling of cells as technology scales allowing higher densities and speeds to be achieved.

SUMMARY, RAMIFICATIONS AND SCOPE.

The disclosure relates to a new method of programming a memory cell, typically of the non-volatile type, with low voltages on the drain and gate electrodes than the prior art cells, using the kinetic energy of the carriers, accelerated close to saturation velocities, to provide a virtual reduction in the barrier height of an insulating gate oxide. This allows use of reduced voltage supplies on the gate and drain of the devices for the write process as disclosed. In addition the current needed to achieve the write process is reduced by using the channel carriers instead of impact ionized carriers. These advantages allow for reduced oxide stress in the cell and hence improved reliability. The use of the channel carriers will also improve the speed of programming of the devices. The implementation of memory cells using this method will provide memory cells which have high reliability and programming speed, and provide non volatile storage.

Although the description above contain many specificity's, these should not be construed as limiting the scope of the invention, but as providing illustrations of the method. It will be possible for those practicing the art to define and implement the method in different substrate materials, such as Gallium Arsenide, and different structural configurations.

What is claimed is

1. A method of programming a memory cell by
   a. using majority charge carriers available in a channel formed under the gate of a MOS device in an on-state,
   b. using kinetic energy of the charge carriers accelerated in the channel of the MOS device,
   c. providing a discontinuity in the channel such that the charge carriers have a velocity directed substantially towards a barrier separating the channel from a floating gate storage node,
   d. applying an additional force in the direction of the velocity of the charge carriers, moving towards the barrier, to enable the carriers to overcome the barrier and be collected by the storage node, wherein the discontinuity in the channel is formed in an intersection of a side wall of a step in a semiconducting substrate material with a surface of the material.
2. The method in claim 1 where the additional force is applied as a voltage induced by coupling on the storage node.

\* \* \* \* \*